US007446017B2

(12) United States Patent
Liu et al.

(10) Patent No.: US 7,446,017 B2
(45) Date of Patent: Nov. 4, 2008

(54) METHODS AND APPARATUS FOR RF SHIELDING IN VERTICALLY-INTEGRATED SEMICONDUCTOR DEVICES

(75) Inventors: Lianjun Liu, Chandler, AZ (US); Philip H. Bowles, Fountain Hills, AZ (US); Li Li, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 121 days.

(21) Appl. No.: 11/444,091

(22) Filed: May 31, 2006

(65) Prior Publication Data

US 2007/0281438 A1 Dec. 6, 2007

(51) Int. Cl.
*H01L 21/30* (2006.01)
(52) U.S. Cl. .................. 438/455; 438/106; 438/107; 438/109; 257/E21.122; 257/E21.567
(58) Field of Classification Search ................. 438/599; 257/E21.087, E21.48
See application file for complete search history.

(56) References Cited

U.S. PATENT DOCUMENTS 6,465,892 B1 * 10/2002 Suga .......................... 257/777

| 6,838,761 B2 | 1/2005 | Karnezos | |
|---|---|---|---|
| 2004/0113254 A1* | 6/2004 | Kamezos | ..................... 257/686 |

OTHER PUBLICATIONS

Yue, C. Patrick, and Wong, S. Simon, On-Chip Spiral Inductors with Patterned Ground Shields for Si-Based RF IC's, IEEE Journal of Solid-State Circuits, vol. 33, No. 5, May 1998 pp. 743-752.
Ramm, Peter, Frauhhofer IZM Presentation, Jun. 20, 2005.

* cited by examiner

*Primary Examiner*—Scott B. Geyer
*Assistant Examiner*—Cheung Lee
(74) *Attorney, Agent, or Firm*—Ingrassia, Fisher & Lorenz, P.C.

(57) ABSTRACT

A patterned ground shield (PGS) (130) in a vertically-integrated structure includes a patterned conductor (e.g., a metallic layer) provided between a first substrate (110) having a first semiconductor device (1120 formed therein and a second substrate (120) having a second device (122) formed therein. A bonding layer (140) is used to bond the vertically-integrated die and/or wafers. The PGS may be formed on a surface (e.g., the backside) of the second (topmost) substrate, or may be formed over the first semiconductor device—for example, on a dielectric layer formed over the first semiconductor device. The PGS may consist of parallel stripes in various patterns, or may be spiral-shaped, lattice-shaped, or the like.

6 Claims, 3 Drawing Sheets

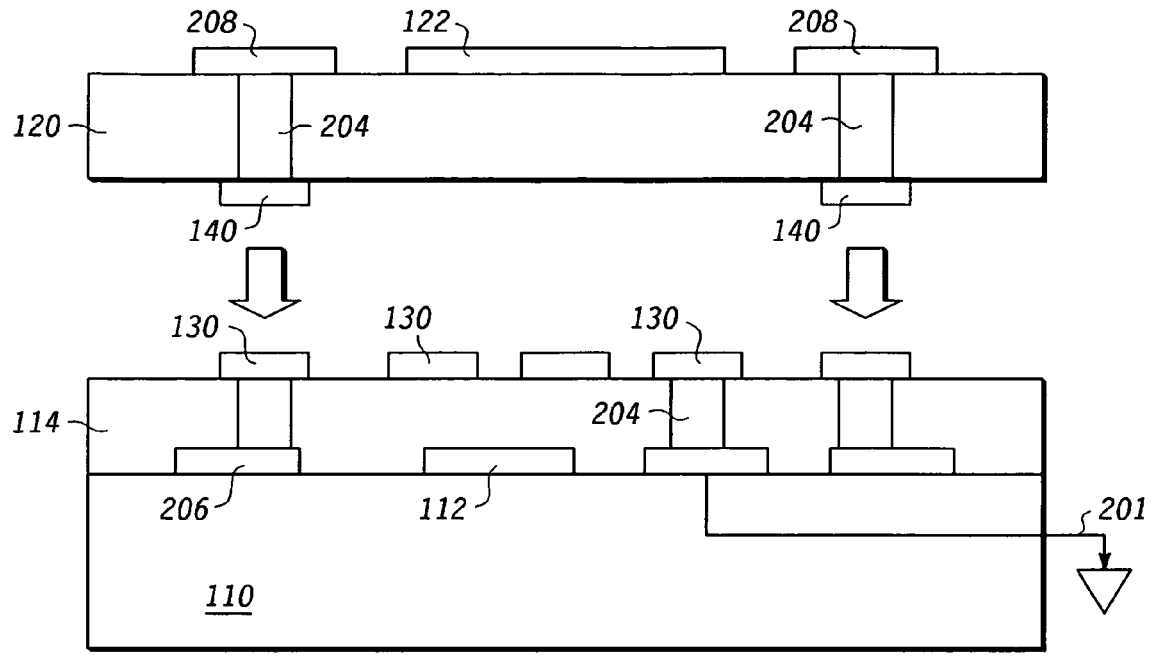
FIG. 5
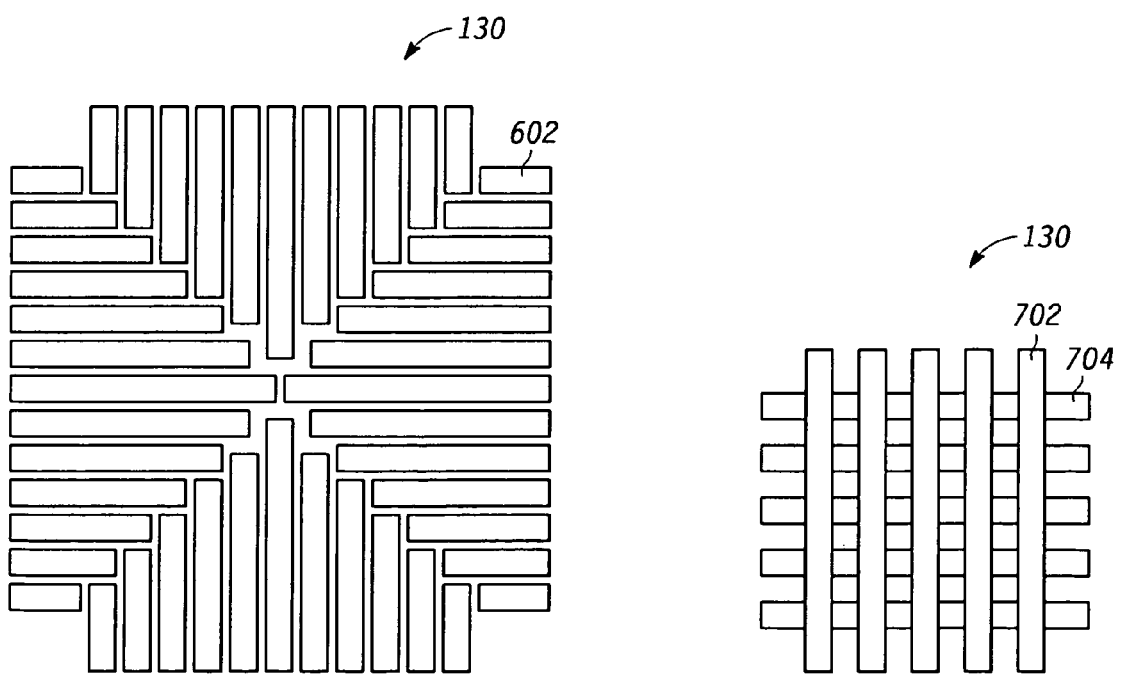
FIG. 6
FIG. 7

need not be described herein.

METHODS AND APPARATUS FOR RF SHIELDING IN VERTICALLY-INTEGRATED SEMICONDUCTOR DEVICES

FIELD OF THE INVENTION

The present invention generally relates to radio-frequency (RF) coupling/interference management in semiconductor devices and, more particularly, to RF shielding in vertically-integrated semiconductor devices.

BACKGROUND OF THE INVENTION

Semiconductor devices continue to increase in size and power-density, resulting in a number of challenges for system designers. One of the primary challenges relates to radio-frequency (RF) shielding—i.e., how to efficiently reduce coupling and interference between neighboring devices. This challenge is even more severe in vertically-integrated devices—i.e., components that consist of multiple stacked layers substrates and devices located very close to each other.

When two or more RF devices are stacked vertically (i.e., in the z-direction), the signals generated by one device within the stack can affect other devices within the stack. This causes significant RF interference and coupling with respect to the devices located above the first devices. While prior art RF semiconductor devices have incorporated various shielding layers within a single integrated circuit, or between adjacent layers on a single substrate, such systems are unsatisfactory in addressing RF coupling and interference between components within vertically-integrated systems.

Accordingly, there is a need for methods that reduce RF coupling and interference in vertically-integrated devices by overcoming these and other shortcomings of the prior art. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

FIG. 5 is a cross-sectional depiction of a device structure being assembled in accordance with an alternate embodiment;

FIG. 6 is a top view of a patterned ground shield in accordance with one embodiment; and FIG. 7 is a top view of a patterned ground shield in accordance with an alternate embodiment.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description. For the purpose of conciseness, conventional methods related to semiconductor processing, semiconductor packaging, radio-frequency devices need not be described herein.

In general, a patterned ground shield (PGS) is incorporated into a vertically-integrated structure, and is configured to reduce coupling and/or interference between neighboring devices in different layers. The PGS may be formed on a surface (e.g., the backside) of the second (topmost) substrate, or may be formed over the first semiconductor device—for example, on a dielectric layer formed over the first semiconductor device. The PGS may be formed during a wafer-level process, prior to stacking.

Figure 1:
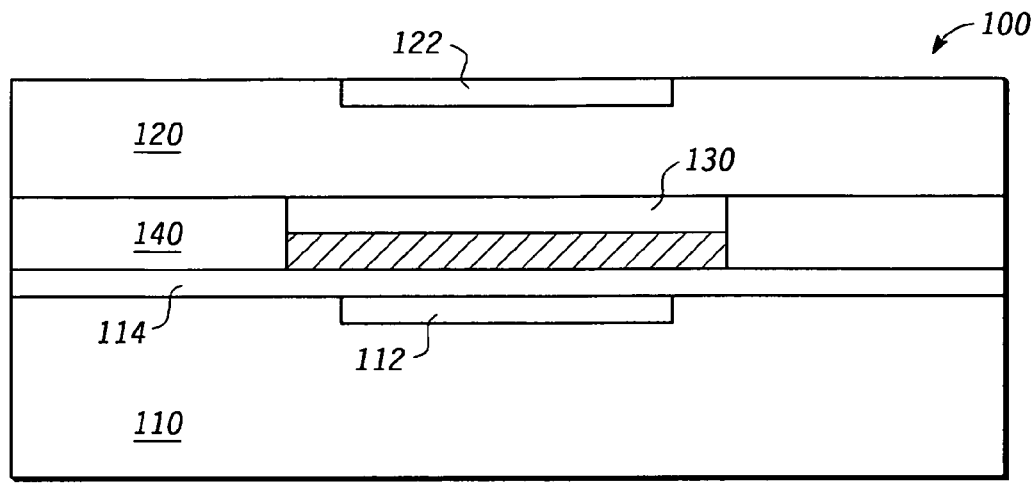
FIG. 1 is a cross-sectional overview of a device structure in accordance with one embodiment.

With reference to the cross-sectional overview shown in FIG. 1, a semiconductor structure 100 in accordance with one embodiment of the present invention generally includes a first substrate 110 having a first semiconductor device 112 formed therein, a second, vertically-integrated substrate 120 having a second device 122 formed therein, and a patterned ground shield ("PGS") 130 disposed between first device 112 and second device 122 such PGS 130 helps to shield device 122 from RF noise and/or coupling related to first semiconductor device 112. A dielectric layer 114 (or multiple dielectric layers) may typically be formed on substrate 110 and/or device 112. PGS 130 may be formed on a surface of substrate 120 (e.g., on the backside, as illustrated), or may be formed on top of dielectric 114 associated with device 112. Substrates 110 and 120 are coupled together using bonding layer 140, as will be discussed further herein.

Substrates 110 and 120 comprise any suitable material, including various semiconductor materials (such as silicon, germanium, gallium arsenide, or the like) as well as any other substrate material now known or later developed. Furthermore, each substrate 110 and 120 may be an entire wafer or a single die (i.e., an individual semiconductor device sawed from the wafer). Thus, the present invention is applicable both "wafer-to-wafer" and "chip-to-wafer" processes. Substrates 110 and 120 might also include other layers known in the art such as seed layers, barrier layers, electroplating, isolation layers, solders, and the like.

In this regard, substrate 110 may be referred to herein as the "bottom layer," and likewise substrate 120 may be referred to as the "top layer." It will be understood, however, that this does not limit the number and orientation of substrates and devices that may be used in connection with the present invention. For the sake of conciseness, the various electronic devices (e.g., devices 112 and 122) are said to be "formed within" substrates 120 and 112, it will be understood, however, that the various layers, diffusions, and interconnects that make up the substrate/device structure will typically include various materials incorporated within, on top of, and throughout the substrate. Thus, for example, while it may be said that one substrate is bonded to another substrate, this will be understood to mean that there may actually be any number of intermediate layers (e.g., dielectric layers, interconnect metallization, etc.) between bonded substrates.

Devices 112 and 122 may be any type of active or passive semiconductor devices (e.g., bipolar power transistors, MOSFETs, or the like) used in the "active area" of the device. In accordance with one embodiment, device 112 is an RF device (e.g., RF power transistor) that generates RF energy during operation. In instances where there are many devices distributed within substrate 110, there will be an RF field of varying amplitude distributed throughout the structure. In practice, the nature of the RF field may be predicted in a number of ways—for example, through various empirical and analytical techniques. Such techniques are well known in the art, and thus need not be described herein.

Regardless of the method of determining the RF field associated with the various devices, it is advantageous to determine, a priori, the areas in which RF coupling and/or interference are likely to be a problem. Once these areas are identified, the shape, size, and location of PGS 130 may be specified for the particular application. Because PGS 130 is generally centered above device 112, RF coupling and interference from device 112 to substrate 120 (and device 122) will be substantially reduced in accordance with known shielding relations. It will be appreciated that while only a single contiguous PGS 130 is shown in FIG. 1, a typical implementation might include any pattern of PGSs 130 strategically located over individual devices 112 formed within substrate 110.

Figure 2:
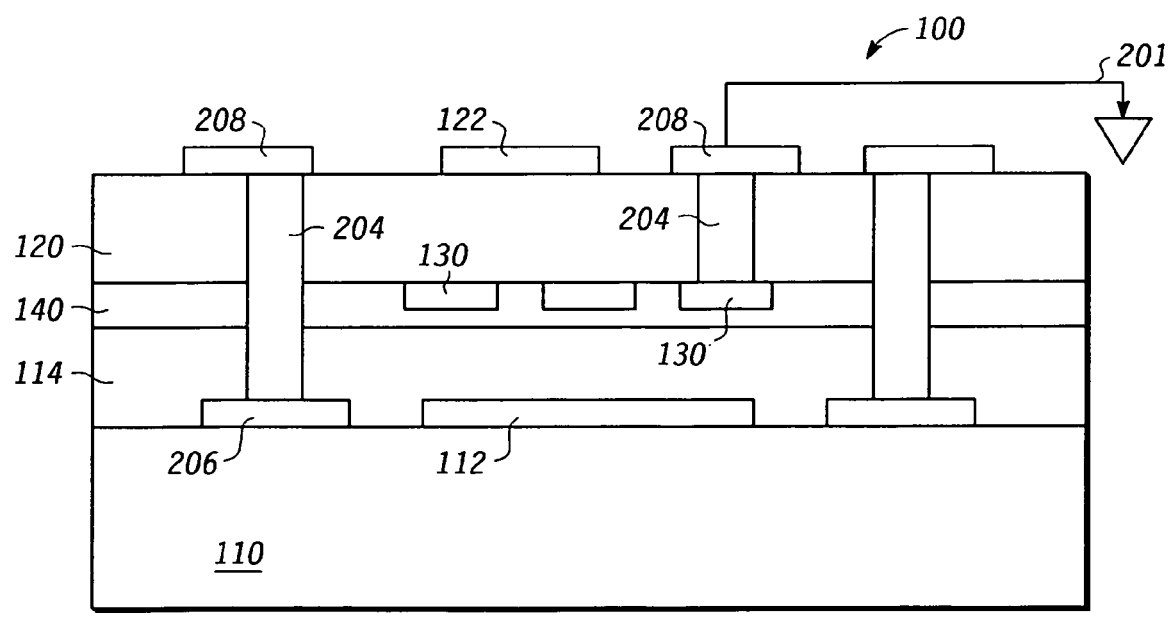
FIG. 2 is a cross-sectional depiction of a device structure in accordance with one embodiment.

Referring to FIG. 2, in one embodiment, PGS 130 is formed on the backside of substrate 120. A bonding layer 140 is provided between dielectric layer 114 and the backside of substrate 120. One or more through-vias 204 provide electrical connectivity between interconnects 206 on substrate 110 and interconnects 208 on substrate 120. PGS 130 is electrically connected to a ground node 201 (which may be external to or internal to structure 100).

PGS 130 may have any suitable geometry and thickness, depending upon the application. In one embodiment, as shown in FIG. 6, PGS 130 includes a series of parallel conductive stripes 602 with small gaps therebetween. In this embodiment, four sets of stripes oriented 90 degrees apart meet in the center as shown. Such an embodiment is particularly effective for shielding structures for inductors requiring a high quality factor (Q). In an alternate embodiment, a lattice-shaped PGS 130 is formed, including two overlapping sets of stripes (702 and 704) oriented 90 degrees apart, as shown. It will be appreciated, however, that the invention is not limited to any of the illustrated PGS patterns, and that a multitude spirals, stripes, and other shapes may be used.

PGS 130 may comprise any material capable of providing the required level of shielding. Suitable materials include, for example, various metallic conductors such as aluminum, gold, and copper. Other conductors such as doped polysilicon may be used. The thickness of PGS 130 may also be selected in accordance with the specific design objectives. In one embodiment, an aluminum or copper PGS 130 with a thickness of between about 0.5 microns and 3.0 microns is used.

Bonding layer 140 is any material suitable for mechanically connecting the vertically-integrated die/wafers/substrates, and may be formed in a variety of ways. Suitable materials for bonding layer 140 include, for example, TEOS, SU-8, polyimide, BCB, LPCVD dielectrics, and LCPs (Liquid Crystal Polymers), and various cross-linked polymers. In other embodiment, a metallic bonding layer is used, as described below.

Figure 3:
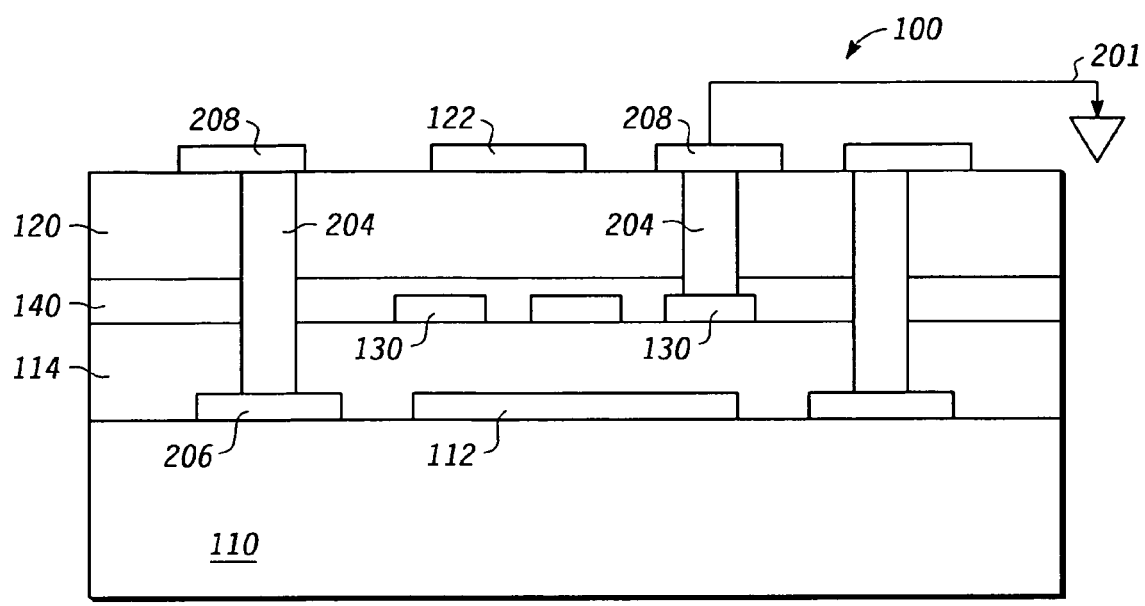
FIG. 3 is a cross-sectional depiction of a device structure in accordance with an alternate embodiment.

In an alternate embodiment, shown in FIG. 3, PGS 130 is formed on dielectric layer 114, which is formed over substrate 110, level 1 devices 112, and conductive contacts 206. A bonding layer 140 is provided to bond substrate 120 to dielectric layer 114 and PGS 130. Through vias 204 are used to couple interconnects 206 to interconnects 208, which are connected to a ground node 201.

Figure 4:
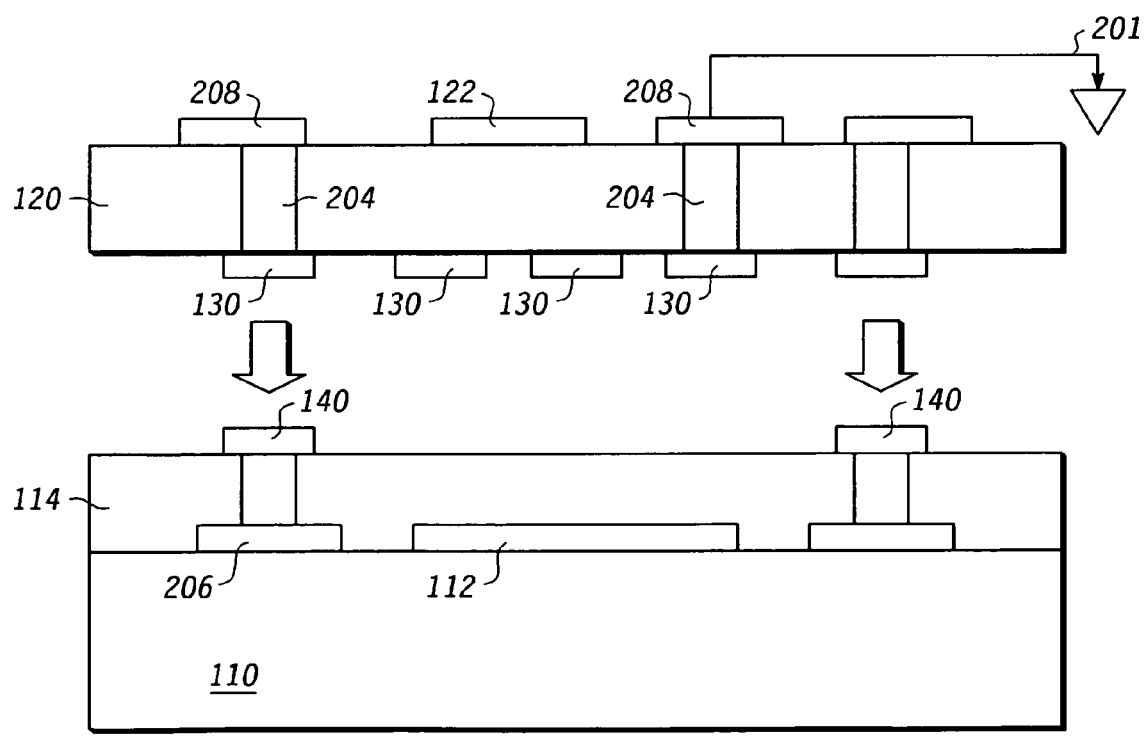
FIG. 4 is a cross-sectional depiction of a device structure in accordance with an alternate embodiment.

Referring to FIG. 4, in another embodiment, PGS 130 is formed on the backside of substrate 120 and a metal bonding layer 140 is used. In one embodiment, PGS 130 comprises Cu with a thin Sn layer on top for bonding, wherein the facing surface of the bonding wafer is Cu. At a bonding temperature of about 260° C.-320° C., the Sn will react with the Cu layers on both wafers to form a CuSn alloy and bond the two wafers together. PGS 130 is connected to interconnects 208 using a through-via 204, and one or more interconnects 208 are coupled to a ground node 201. Similarly, with reference to FIG. 5, another embodiment includes forming PGS 130 on top of dielectric layer 114. PGS 130 is coupled to interconnects 206 using through-vias 204, which are coupled to ground node 201. A metal bonding layer 140 is deposited on the backside of substrate 140 such that the layer makes contacts with interconnects 208 by way of through-vias 204.

In summary, a semiconductor structure comprises: a first substrate having a first semiconductor device formed therein; a second substrate having a second device formed therein, wherein the second substrate is vertically-integrated with the first substrate; and a patterned ground shield layer disposed between the first device and the second device. The semiconductor structure may further include a bonding layer provided between the first substrate and the second substrate, wherein the patterned ground shield is disposed within the bonding layer. The bonding layer may comprise, for example, a material selected from the group consisting of polymers, dielectrics, and semiconductors.

In one embodiment, the patterned ground shield is formed on a surface of the second substrate. In another, the structure further includes a dielectric layer formed on the first semiconductor device, wherein the patterned ground shield is formed on the dielectric layer. The patterned ground shield is preferably electrically grounded—e.g., using a through-via formed in the second substrate, wherein the through-via couples the patterned ground shield to a ground node.

In one embodiment, the first substrate is a wafer, and the second substrate is a semiconductor die. In another embodiment, the first substrate is a wafer, and the second substrate is a wafer. In another, the first substrate is a semiconductor die and the second substrate is a semiconductor die.

The patterned ground shield may comprise a metallic conductor. In one embodiment, the patterned ground shield is an aluminum layer having a thickness of between approximately 0.5 microns and 3.0 microns. In one embodiment, the patterned ground shield includes a plurality of parallel stripes. In another, the patterned ground shield is lattice-shaped or spiral shaped.

A method in accordance with one embodiment includes: providing a first substrate having a first device formed therein; providing a second substrate having a second device formed therein; forming a patterned ground shield between the first device and the second device; and bonding the first substrate to the second substrate. The bonding step may include providing a bonding layer comprising a material selected from the group consisting of polymers and dielectrics. In one embodiment, forming the patterned ground shield includes forming a metallic conductor.

The process may include forming the patterned ground shield on the second substrate or, alternatively, forming a dielectric layer on the first semiconductor device and forming the patterned ground shield on the dielectric layer. In a specific embodiment, formation of the patterned ground shield includes depositing a layer of aluminum having a thickness of between 0.5 microns and 3.0 microns.

It should be appreciated that the exemplary embodiment or exemplary embodiments presented above are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming a stacked die semiconductor structure, the method comprising:
   providing a first semiconductor substrate having a first device formed therein;
   providing a second semiconductor substrate having a second device formed therein, the second semiconductor substrate having a first set of vias extending therethrough to a metallic bonding layer;
   forming an interconnect on the first semiconductor substrate;
   forming a dielectric layer on the first semiconductor substrate;
   forming a second set of vias through the dielectric layer such that it contacts the interconnect and extends through the dielectric layer;
   forming a patterned ground shield on the dielectric layer such that it contacts the second set of vias; and
   directly bonding the bonding layer to the patterned ground shield.

2. The method of claim 1, wherein forming the patterned ground shield includes forming a metallic conductor.

3. The method of claim 1, wherein forming the patterned ground shield includes depositing a layer of aluminum having a thickness of between 0.5 microns and 3.0 microns.

4. The method of claim 1, wherein the bonding layer has a pattern substantially conforming to a pattern defined by the first set of vias.

5. The method of claim 4, wherein the second set of vias has a pattern substantially conforming to the pattern defined by the first set of vias.

6. The method of claim 4, wherein the bonding layer includes metallic regions having an area substantially the same as the area of the first set of vias extending through the first semiconductor substrate.

* * * * *